United States Patent
Prasher

(10) Patent No.: US 7,633,752 B2
(45) Date of Patent: Dec. 15, 2009

(54) COOLING AN INTEGRATED CIRCUIT DIE WITH COOLANT FLOW IN A MICROCHANNEL AND A THIN FILM THERMOELECTRIC COOLING DEVICE IN THE MICROCHANNEL

(75) Inventor: Ravi Prasher, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 992 days.

(21) Appl. No.: 10/811,597

(22) Filed: Mar. 29, 2004

(65) Prior Publication Data

US 2005/0213301 A1    Sep. 29, 2005

(51) Int. Cl.
    *H05K 7/20* (2006.01)
(52) U.S. Cl. ............... 361/688; 361/687; 361/704; 361/705
(58) Field of Classification Search ......... 361/717, 361/704, 699, 700, 698; 165/80.4, 15.2; 174/15.1, 15.2; 257/712, 714; 136/201; 62/331, 3.1–3.3
    See application file for complete search history.

(56) References Cited

U.S. PATENT DOCUMENTS

| | | | | |
|---|---|---|---|---|
| 3,232,719 | A * | 2/1966 | Ritchie | 428/620 |
| 4,894,709 | A | 1/1990 | Phillips et al. | |
| 4,938,280 | A * | 7/1990 | Clark | 165/80.4 |
| 5,239,200 | A * | 8/1993 | Messina et al. | 257/714 |
| 5,291,064 | A * | 3/1994 | Kurokawa | 257/714 |
| 5,345,107 | A * | 9/1994 | Daikoku et al. | 257/717 |
| 5,457,342 | A | 10/1995 | Herbst, II | |
| 5,528,456 | A * | 6/1996 | Takahashi | 361/704 |
| 5,569,950 | A * | 10/1996 | Lewis et al. | 257/467 |
| 5,637,921 | A * | 6/1997 | Burward-Hoy | 257/712 |
| 5,880,524 | A * | 3/1999 | Xie | 257/704 |
| 5,918,469 | A * | 7/1999 | Cardella | 62/3.7 |
| 6,094,919 | A * | 8/2000 | Bhatia | 62/3.7 |
| 6,125,921 | A * | 10/2000 | Kuo | 165/80.3 |
| 6,278,049 | B1 * | 8/2001 | Johnson et al. | 136/201 |
| 6,351,384 | B1 * | 2/2002 | Daikoku et al. | 361/704 |
| 6,410,971 | B1 * | 6/2002 | Otey | 257/467 |
| 6,424,533 | B1 * | 7/2002 | Chu et al. | 361/719 |

(Continued)

FOREIGN PATENT DOCUMENTS

WO    WO 02/39241 A2    5/2002

(Continued)

OTHER PUBLICATIONS

"PCT Notification of Transmittal of the International Search Report", mailed Oct. 10, 2005, for PCT/US2005/010177.

*Primary Examiner*—Tuan T Dinh
(74) *Attorney, Agent, or Firm*—Buckley, Maschoff & Talwalkar LLC

(57) ABSTRACT

An apparatus includes an integrated circuit (IC) die that has a front surface on which an integrated circuit is formed. The IC die also has a rear surface that is opposite to the front surface. The apparatus also includes a microchannel member to define at least one microchannel at the rear surface of the IC die. The microchannel is to allow a coolant to flow through the microchannel. The apparatus further includes at least one thin film thermoelectric cooling (TFTEC) device in the at least one microchannel.

22 Claims, 6 Drawing Sheets

U.S. PATENT DOCUMENTS

| | | | |
|---|---|---|---|
| 6,489,551 B2 * | 12/2002 | Chu et al. | 136/230 |
| 6,581,388 B2 * | 6/2003 | Novotny et al. | 62/3.7 |
| 6,678,168 B2 * | 1/2004 | Kenny et al. | 361/764 |
| 6,696,635 B2 * | 2/2004 | Prasher | 136/201 |
| 6,711,904 B1 * | 3/2004 | Law et al. | 62/3.2 |
| 6,722,140 B2 * | 4/2004 | Venkatasubramanian | 62/3.2 |
| 6,794,760 B1 * | 9/2004 | Jaeck et al. | 257/784 |
| 6,919,231 B1 * | 7/2005 | Ramanathan et al. | 438/122 |
| 6,934,154 B2 * | 8/2005 | Prasher et al. | 361/699 |
| 7,000,684 B2 * | 2/2006 | Kenny et al. | 165/80.4 |
| 7,029,951 B2 * | 4/2006 | Chen et al. | 438/122 |
| 7,078,803 B2 * | 7/2006 | Tilton et al. | 257/714 |
| 2002/0174660 A1 | 11/2002 | Venkatasubramanian | |

FOREIGN PATENT DOCUMENTS

WO 103 13 685 A1 10/2003

* cited by examiner

COOLING AN INTEGRATED CIRCUIT DIE WITH COOLANT FLOW IN A MICROCHANNEL AND A THIN FILM THERMOELECTRIC COOLING DEVICE IN THE MICROCHANNEL

BACKGROUND

As microprocessors continue to advance in complexity and operating rate, the heat generated in microprocessors during operation increases and the demands on cooling systems for microprocessors also escalate. A particular problem is presented by so-called "hotspots" at which circuit elements at a localized zone on the microprocessor die raise the temperature in the zone above the average temperature on the die. Thus it may not be sufficient to keep the average temperature of the die below a target level, as excessive heating at hotspots may result in localized device malfunctions even while the overall cooling target is met.

DETAILED DESCRIPTION

Figure 1:
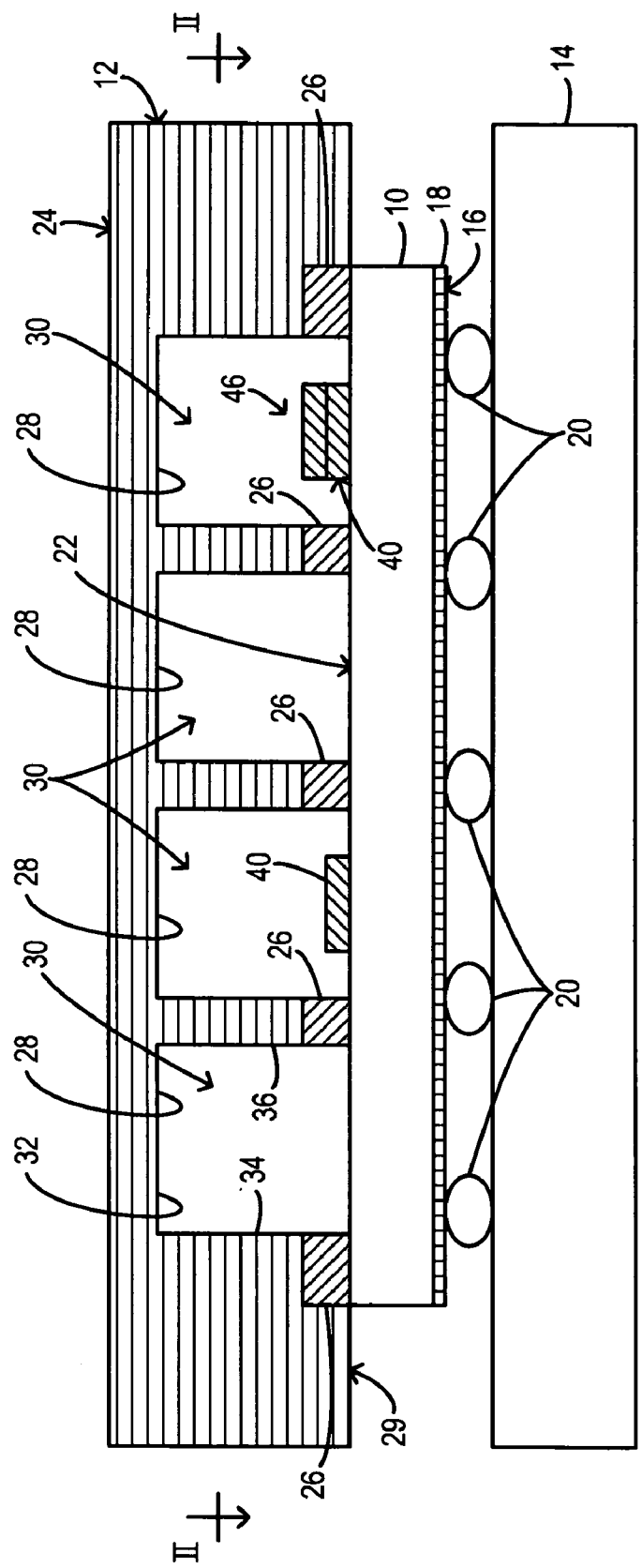
FIG. 1 is a partial schematic side cross-sectional view of an integrated circuit (IC) die with a portion of a cooling system and packaging for the die, as provided according to some embodiments.

FIG. 1 is a partial schematic side cross-sectional view of an integrated circuit (IC) die 10 with a portion of a cooling system 12 and a die packaging substrate 14, as provided according to some embodiments. To simplify the drawing, various aspects of the die package are omitted.

Figure 2:
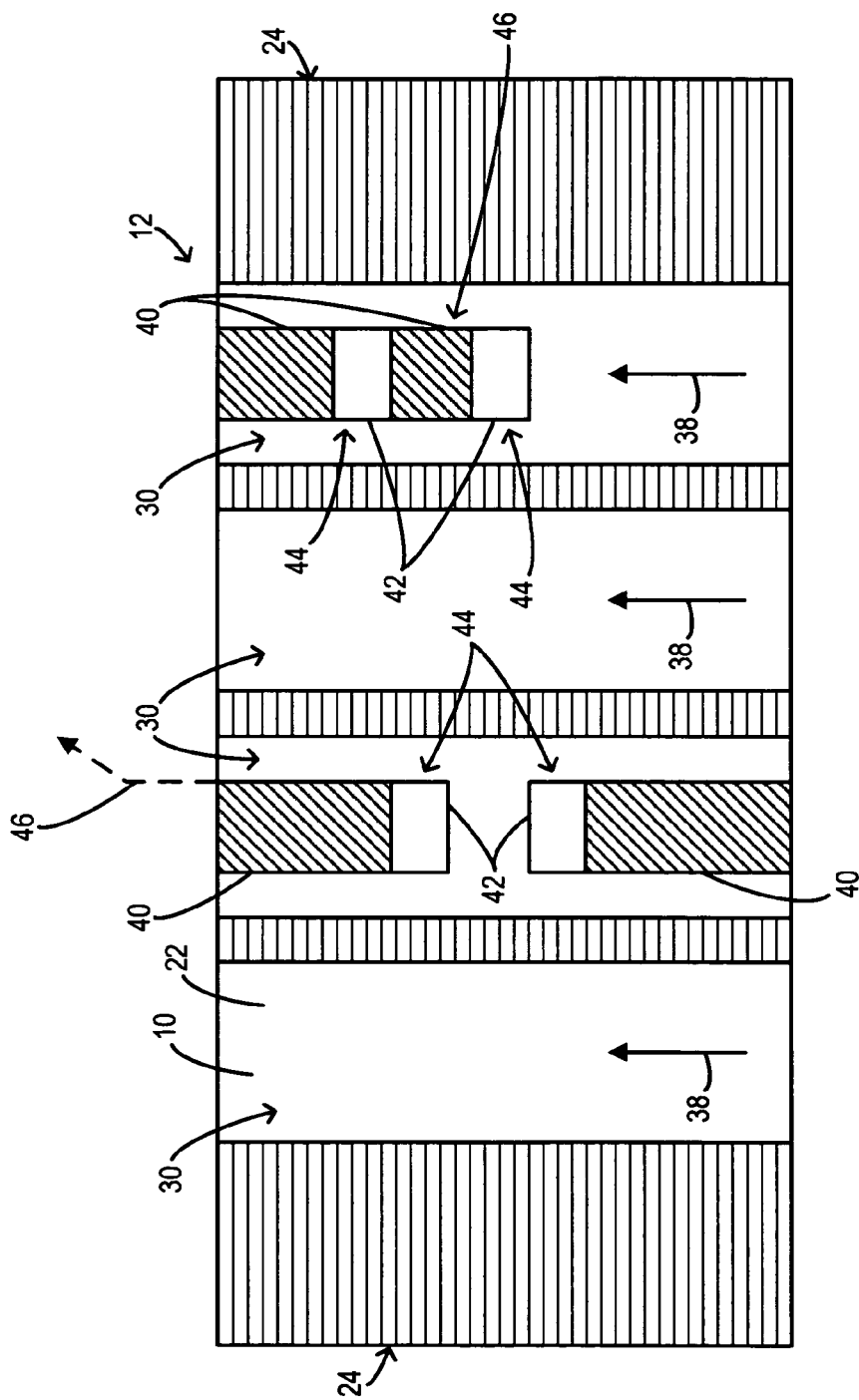
FIG. 2 is a partial schematic cross-sectional view from above, taken at line II-II in FIG. 1.

FIG. 2 is a partial schematic cross-sectional view of the IC die and cooling system, taken in plan view at line II-II in FIG. 1. Both FIGS. 1 and 2 show simplified examples of the cooling system components, and in practice the layout of cooling system components may be much more complex than illustrated in the drawings. In general the drawings herein are not to scale.

Referring to FIG. 1, the IC die 10 is mounted on the package substrate 14 in a conventional "flip-chip" arrangement. The IC die 10 may be formed of a conventional semiconductor material such as silicon. The IC die 10 has front surface 16 on which an integrated circuit 18 (e.g., a microprocessor) is formed. The integrated circuit 18 is directly coupled to the package substrate 14 by die bumps 20. (Traces, etc., present in the substrate 14, and to which the integrated circuit 18 is coupled by the die bumps 20, are not separately shown. "Landside" bumps on the package substrate 14 are also omitted from the drawing. The die bumps 20 may be more numerous than as depicted in FIG. 1.)

The IC die 10 also has a rear surface 22 that is opposite to the front surface 16 of the IC die 10. A microchannel member 24 is bonded to the rear surface 22 of the IC die 10 by bonding material 26. Grooves 28 are formed in the front side 29 of the microchannel member 24 to allow the microchannel member 24 to define microchannels 30. The front side 29 of the microchannel member 24 faces the rear surface 22 of the IC die 10. It will be noted that the grooves 28 of the microchannel member 24 define the microchannels 30 in cooperation with the rear surface 22 of the IC die 10, with the rear surface 22 forming the floors of the microchannels 30. In some embodiments, the grooves 28 may have a rectangular cross-section (as depicted in the drawing) so that the microchannels 30 also have a rectangular cross-section, but other shapes of cross-section are also possible. In some embodiments, the microchannels 30 may have a height (distance from rear surface 22 of the IC die 10 to the top wall 32 of the groove 28) of about 300 microns and a width (distance from one side wall 34 of the groove 28 to the other side wall 36 of the groove 28) of about 200 microns, but other dimensions of the microchannels 30 are possible. In a practical embodiment, the number of microchannels may be much more than the relatively few microchannels depicted in the drawing.

In some embodiments the microchannel member 24 may be a heat spreader, such as an integrated heat spreader (IHS) formed of copper or aluminum, which may be provided in accordance with conventional practices except for the presence of the grooves 28. In other embodiments, the member 24 may not be a heat spreader, but may still be formed of copper or aluminum, or alternatively of silicon. The grooves 28 may be formed in the member 24 by a lithographic process or by micro-machining. Bonding of the member 24 to the rear surface 22 of the IC die 10 may be with gold or solder or by another suitable technique such as thermal compression bonding. Noting again that the drawings are not to scale, the member 24 (whether or not it is a heat spreader) may be substantially thicker than the height of the microchannels 30, and the microchannels may be much narrower than suggested by the drawings.

The microchannels 30 are provided to allow a coolant (not shown) to flow through the microchannels 30. In some embodiments, the coolant may be de-ionized water. Flow of the coolant through the microchannels 30 is schematically represented by arrows 38 in FIG. 2. (It should be understood that coolant may flow through a microchannel 30 even if an arrow 38 is not indicated in the particular microchannel.)

It should be noted that the manner of defining the microchannels depicted in FIG. 1 contrasts with a previously proposed practice of forming microchannels by lithography or the like directly in the rear surface of the IC die.

The microchannels 30 need not all be straight and parallel to each other.

Referring now to both of FIGS. 1 and 2, the cooling system 12 also includes, in addition to the microchannels 30, thin film thermoelectric cooling (TFTEC) devices 40. The TFTEC devices 40 are formed on the rear surface 22 of the IC die 10 and are located in at least some of the microchannels 30. Terminals 42 (seen in FIG. 2) are provided at ends 44 of the TFTEC devices 40. Except as schematically indicated at 46 in FIG. 2, leads to supply electrical power to drive the TFTEC devices 40 are not shown to simplify the drawing. However, such leads are present, and may be formed on the rear surface 22 of the IC die 10 at the terminals 42. The leads may be isolated from the coolant to prevent electrical shorts by covering the leads with an insulating layer (not shown) such as silicon oxide. In addition, or alternatively, the coolant may be a dielectric or de-ionized water.

In some embodiments, two or more TFTEC devices 40 may be formed in a vertical stack. For example, as indicated at 46 in FIGS. 1 and 2, a stacked pair of TFTEC devices 40 may be provided. As can be seen from FIG. 2, the two TFTEC devices 40 of a stacked pair need not be coterminous.

In some embodiments, each TFTEC device 40 may have a thickness of about 5 microns, a width in the range of 5 to 50 microns and a length in the range of 5 to 50 microns. (Again it is noted that the drawings are not to scale.) Accordingly, given a height of hundreds of microns for the microchannels 30, the presence of the TFTEC devices 40 in the microchannels 30 does not have a significant effect on the flow of coolant through the microchannels. The TFTEC devices 40 may in some embodiments be formed of a material such as silicon germanium superlattice or beryllium telluride ($Be_2Te_3$).

As suggested by the drawings, the TFTEC devices 40 may be present in some but not all of the microchannels 30, in some embodiments. In particular, TFTEC devices may be placed at specific locations that may be hotspots on the IC die 10. In other embodiments, TFTEC devices 40 are present in all of the microchannels 30. Stacking of the TFTEC devices 40 may occur where cooling needs are particularly acute.

Figure 3:
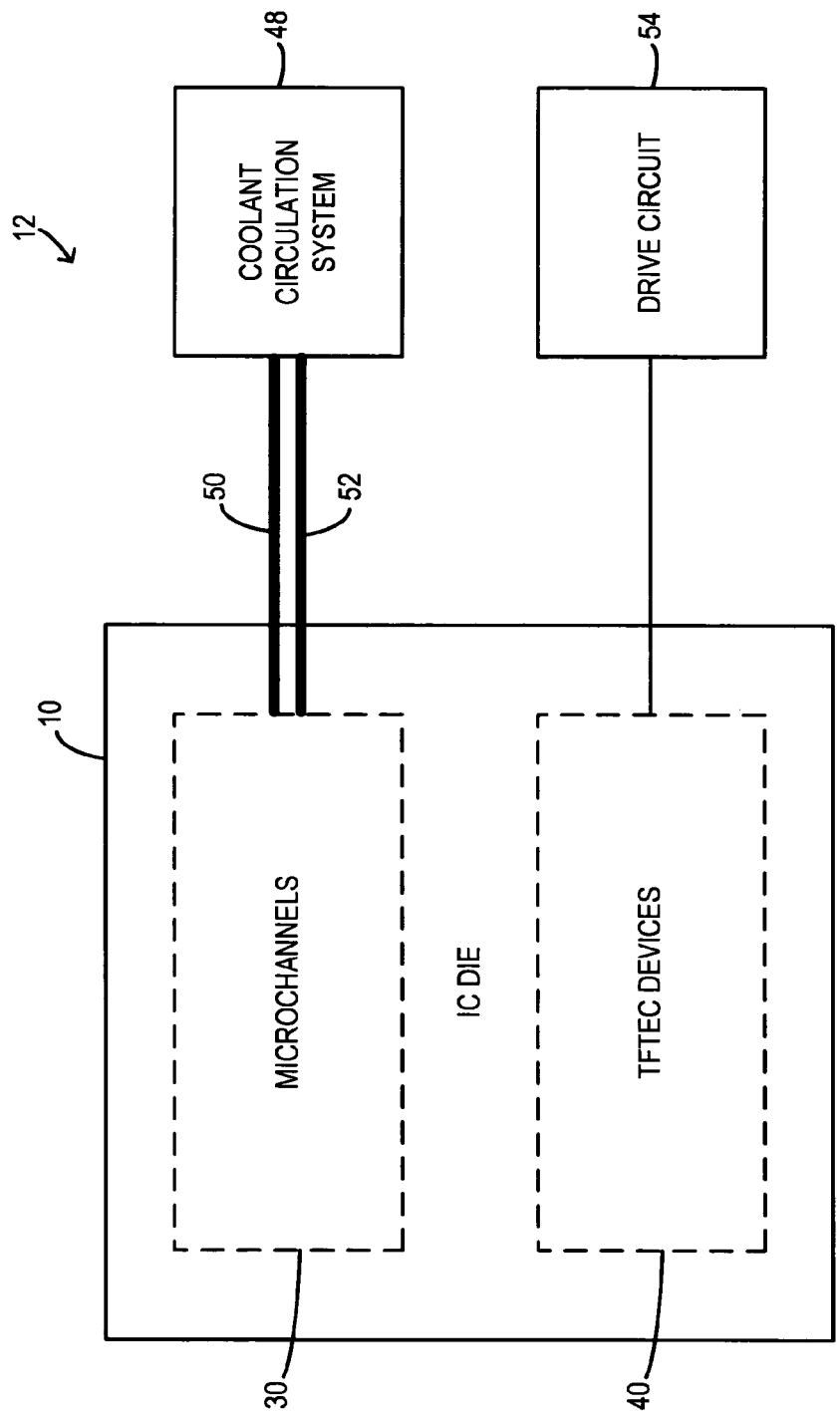
FIG. 3 is block diagram showing the die of FIG. 1, with additional components of the cooling system for the die.

FIG. 3 is a block diagram showing the IC die 10, with additional components of the cooling system 12. For purposes of illustration, the microchannels 30 and the TFTEC devices 40 are shown as separate blocks in phantom, although in practice the TFTEC devices 40 are located in the microchannels 30.

As illustrated in FIG. 3, the cooling system 12 includes a coolant circulation system 48 to supply the coolant to the microchannels 30. The coolant circulation system 48 may be in fluid communication with the microchannels 30 via one or more coolant supply channels 50 and one or more coolant return channels 52. Although not separately shown, a pump and a heat exchanger located remotely from the die 10 may be included in the coolant circulation system 48.

The coolant system 12 also includes a drive circuit 54 that is coupled to the TFTEC devices 40 to supply electrical power to the TFTEC devices 40. In some embodiments, the drive circuit 54 may be mounted on the package for the IC die 10. (Only the package substrate 14 is shown in the drawings.) In some embodiments, the drive circuit 54 may also supply power to the integrated circuit 18 (FIG. 1). In other words, the integrated circuit 18 and the TFTEC devices 40 may share a power supply, in some embodiments.

Figure 4:
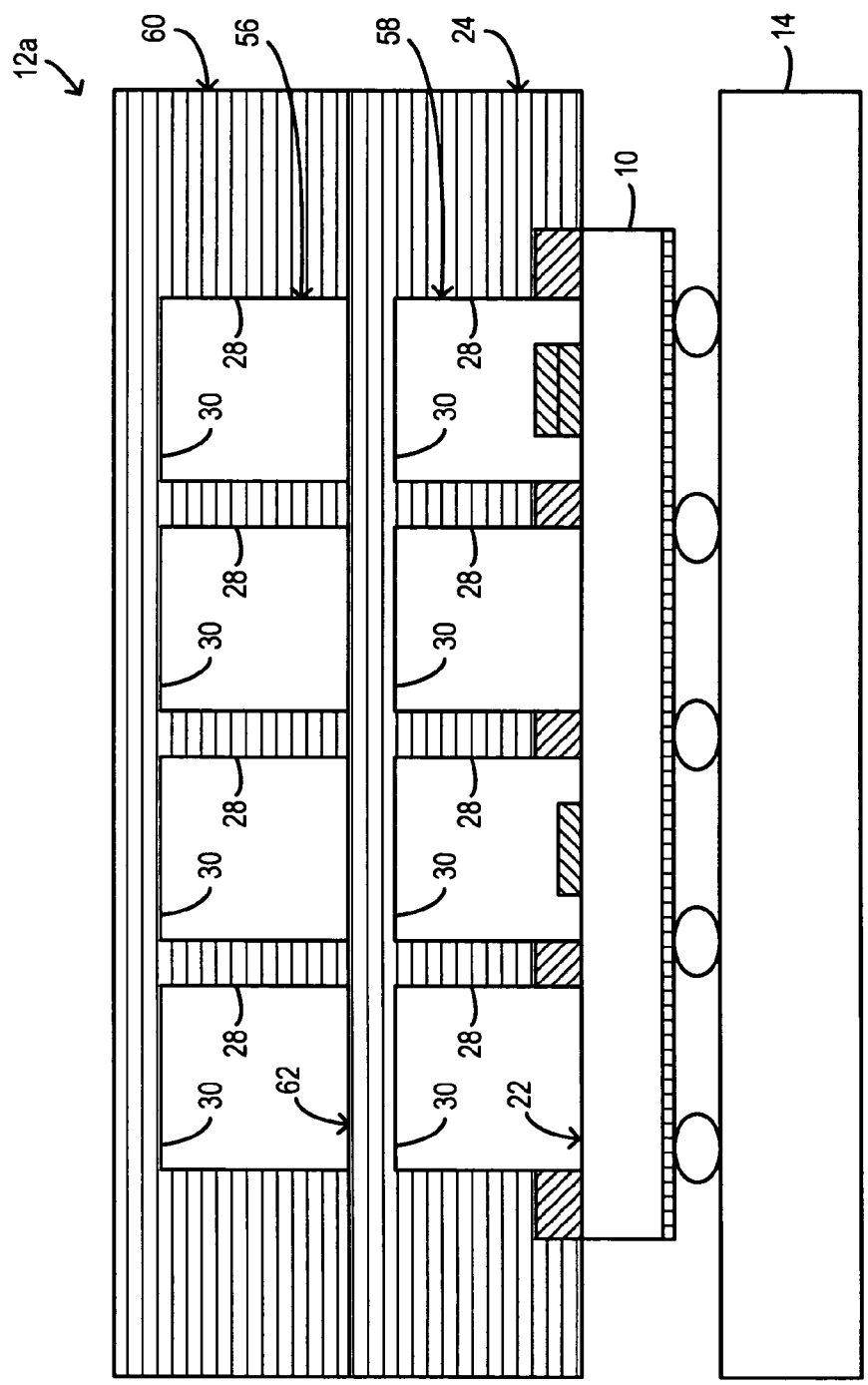
FIG. 4 is a view similar to FIG. 1, showing the IC die and a portion of the cooling system and die packaging as provided according to some other embodiments.

Referring now to FIG. 4, in some embodiments a second tier 56 of microchannels 30 is provided above the first tier 58 of microchannels 30 in a cooling system 12*a*. In the embodiments illustrated in FIG. 4, the microchannel member 24 is not much thicker than the height of the microchannels 30 of the first tier 58 and is interposed between the IC die 10 and a heat spreader (or other member) 60. In these embodiments, the microchannels of the first tier 58 are defined by the rear surface 22 of the IC die 10 and by grooves 28 in the microchannel member 24; and the microchannels of the second tier 56 are defined by the rear surface 62 of the microchannel member 24 and grooves 28 in the heat spreader 60. In these embodiments, the floor of the microchannels of the second tier 56 is formed by the rear surface 62 of the microchannel member 24.

As before, the microchannel member 24 may be formed of copper, aluminum or silicon in some embodiments. The heat spreader 60 may, for example, be formed of copper or aluminum. The heat spreader 60 may have a thickness that is substantially greater than the height of the microchannels of the second tier 56. In some embodiments, the height of the microchannels of the second tier 56 may be substantially the same (e.g., 300 microns) as the height of the microchannels of the first tier 58.

Figure 5:
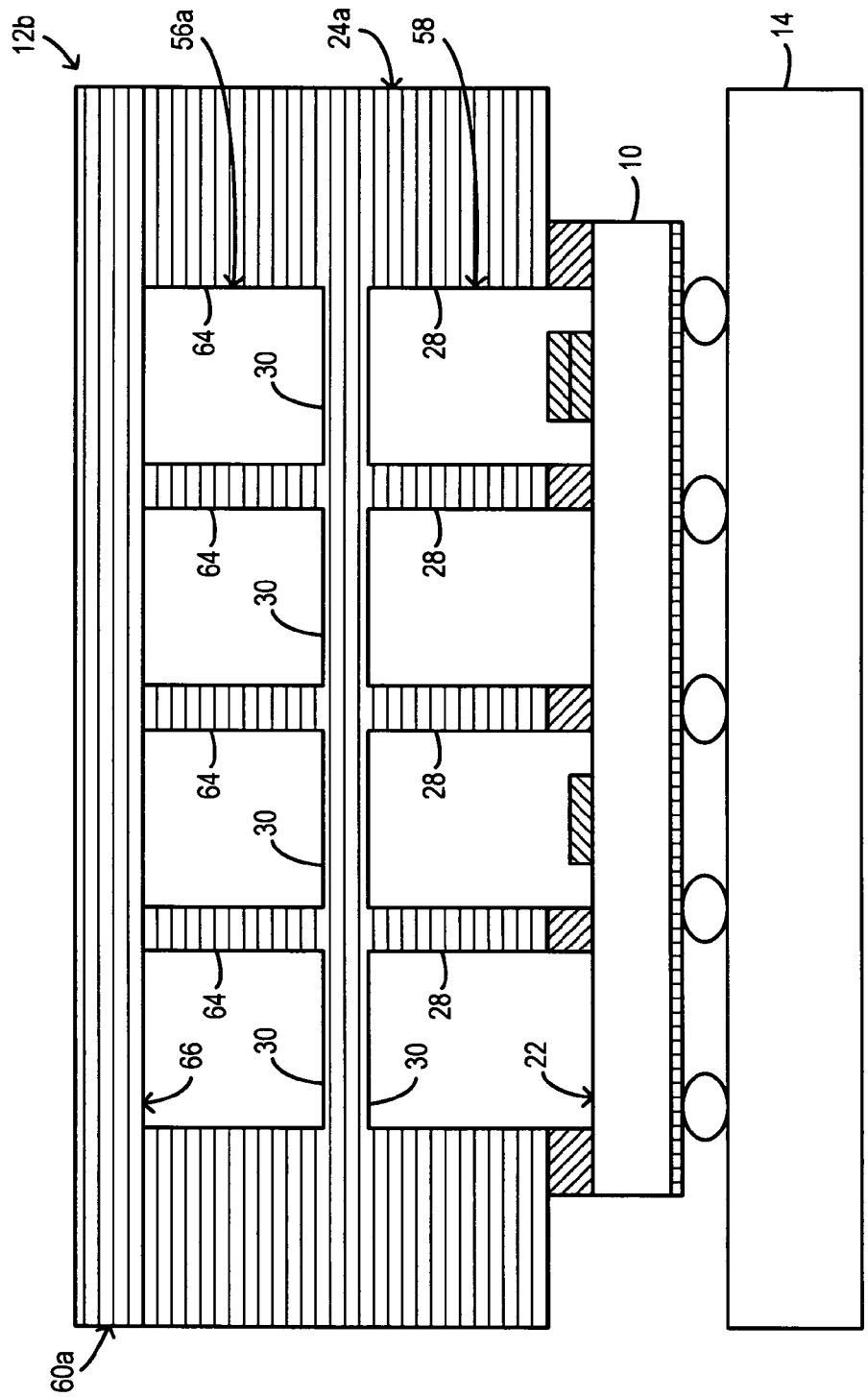
FIG. 5 is a view similar to FIGS. 1 and 4, showing the IC die and a portion of the cooling system and die packaging as provided according to still other embodiments.

In other embodiments in which two tiers of microchannels are provided, as illustrated in FIG. 5, a microchannel member 24*a* has grooves 28 that face down and grooves 64 that face up. In these embodiments, the cooling system 12*b* includes a first tier 58 of microchannels and a second tier 56*a* of microchannels. The microchannel member 24*a* is interposed between a heat spreader 60*a* and the rear surface 22 of the IC die 10. As in the embodiment of FIG. 4, the microchannels of the first tier are defined by the rear surface 22 of the IC die 10 and by the downward-facing grooves 28 in the microchannel member 24, but the microchannels of the second tier 56*a* of FIG. 5 are defined by the front surface 66 of the heat spreader 60*a* and the upward-facing grooves 64 in the microchannel member 24*a*. In these embodiments, the top wall of the microchannels of the second tier 56*a* is formed by the front surface 66 of the heat spreader 60*a*.

The cooling systems 12*a* and 12*b* may have substantially the same coolant circulation systems and drive circuit as the cooling system 12 of FIGS. 1-3.

In operation of the cooling systems 12, 12*a* or 12*b*, coolant (not shown) supplied by the coolant circulation system 48 (FIG. 3) flows through the microchannels 30 at or above the rear surface of the IC die 10 to aid in cooling the IC die 10. In some embodiments the coolant is operated with two phases—liquid and vapor. That is, in some embodiments at least part of the coolant in the microchannels is in a gaseous state. In other embodiments the coolant is single phase—that is, all liquid. In some embodiments, two phase operation is employed with a single tier of microchannels. In other embodiments, single phase operation is employed with two or more tiers of microchannels. In either case, the thermal resistance of the cooling system may be very low. In still other embodiments, single phase operation is employed with a single tier of microchannels.

Also as part of the operation of the cooling systems 12, 12*a*, 12*b*, the IC die is cooled by operation of the TFTEC devices 40 formed on the rear surface of the IC die. The presence of the TFTEC devices may mitigate effects of hotspots on the IC die due to localized characteristics of the integrated circuit 18. Also, the coolant flowing on the top ("hot side") of the TFTEC devices may enhance the effectiveness of the TFTEC devices by aiding in dissipation of the heat transported by the TFTEC devices from the IC die. The combination of the coolant flowing in the microchannels and the operation of the TFTEC devices may aid in achieving a lower average temperature for the IC die than is achieved by conventional die cooling arrangements.

The cooling systems described herein, which include both microchannels at and/or adjacent to the rear surface of the IC die, and TFTEC devices formed on the rear surface of the IC die in at least some of the microchannels, may be applicable both to conventional flip-chip mounted dies and to so-called "thin die thin TIM" IC packages, where "TIM" refers to thermal interface material.

Figure 6:
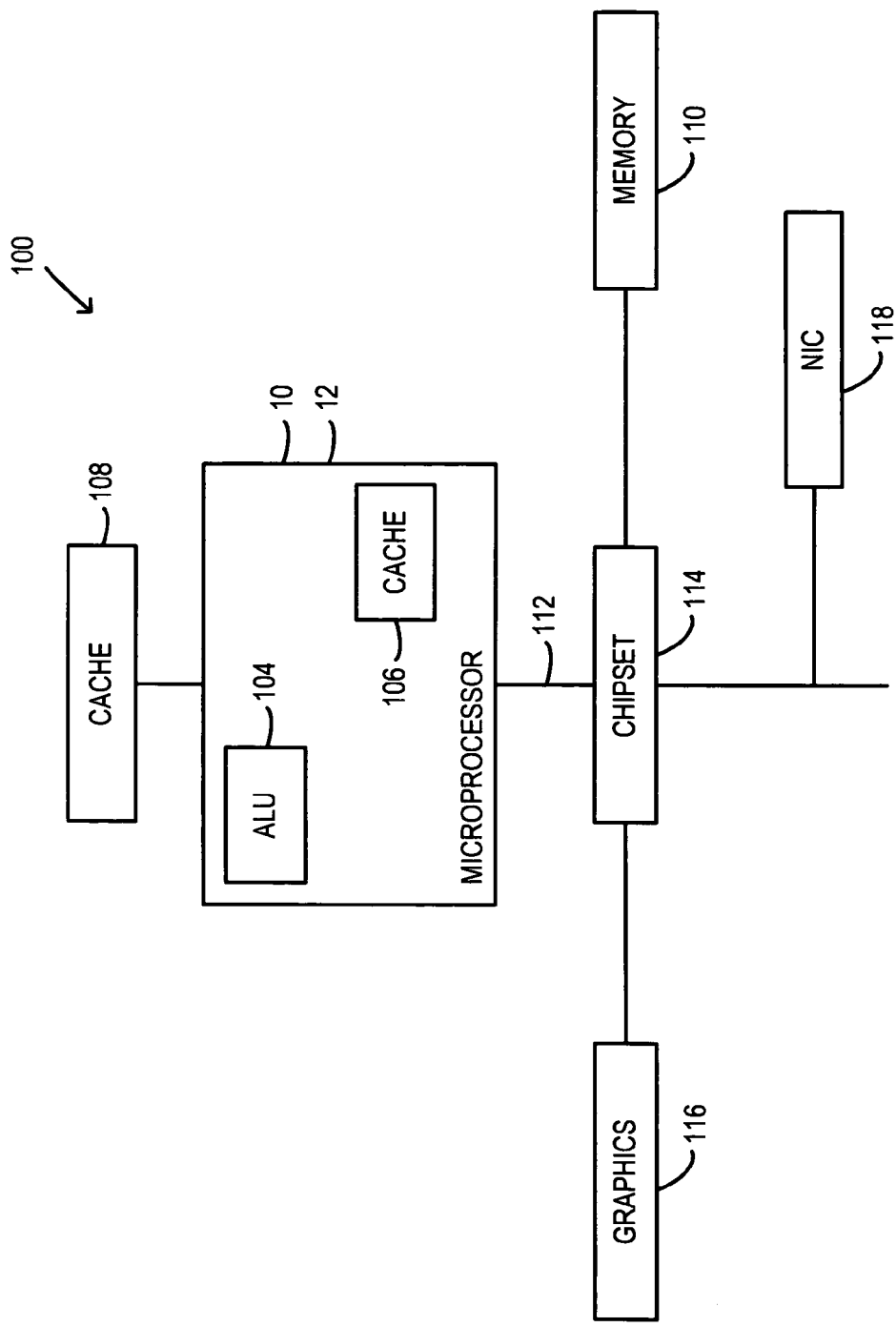
FIG. 6 is a block diagram of a computer system that includes an example of an IC die associated with a cooling system as in one or more of FIGS. 1-5.

As noted above, the integrated circuit 18 formed on the front surface of the IC die 10 may be a microprocessor in some embodiments. FIG. 6 is a block diagram of a system 100 in which such a die 10 may be incorporated. Although not separately indicated in FIG. 6, a cooling system 12 as disclosed hereinabove (or a cooling system 12*a* or 12*b*) may be associated with the die 10.

In FIG. 6, the die 10 includes many sub-blocks, such as arithmetic logic unit (ALU) 104 and on-die cache 106. The microprocessor on die 10 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with the microprocessor on die 10 via appropriate busses or ports.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   an integrated circuit (IC) die having a front surface on which an integrated circuit is formed and a rear surface that is opposite to the front surface;
   a member to define at least one microchannel at the rear surface of the IC die, the microchannel to allow a coolant to flow therethrough; and
   at least one thin film thermoelectric cooling (TFTEC) device in the at least one microchannel.

2. The apparatus of claim 1, wherein the at least one TFTEC device is formed on the rear surface of the IC die.

3. The apparatus of claim 1, wherein the member is an integrated heat spreader.

4. The apparatus of claim 1, wherein the member is formed of silicon.

5. The apparatus of claim 1, wherein the member is formed of copper.

6. The apparatus of claim 1, wherein the coolant includes water.

7. The apparatus of claim 1, wherein the TFTEC device includes one of silicon germanium superlattice and beryllium telluride.

8. The apparatus of claim 1, wherein the member is bonded to the rear surface of the IC die.

9. The apparatus of claim 1, wherein the integrated circuit formed on the front surface of the IC die is a microprocessor.

10. The apparatus of claim 1, wherein the at least one TFTEC device includes at least one pair of stacked TFTEC devices.

11. The apparatus of claim 2, wherein the member has a front side which faces the rear surface of the IC die, said front side of the member having at least one groove therein to define the at least one microchannel.

12. The apparatus of claim 3, wherein the member is formed of copper.

13. The apparatus of claim 6, wherein the coolant is de-ionized water.

14. The apparatus of claim 8, further comprising a heat spreader;
    the member interposed between the heat spreader and the rear surface of the IC die;
    the at least one microchannel including:
       a first tier of microchannels defined by the rear surface of the IC die and by grooves in the member; and
       a second tier of microchannels defined by a front surface of the heat spreader and grooves in the member, the second tier of microchannels being above the first tier of microchannels.

15. The apparatus of claim 8, further comprising a heat spreader;
    the member interposed between the heat spreader and the rear surface of the IC die;
    the at least one microchannel including:
       a first tier of microchannels defined by the rear surface of the IC die and by grooves in the member; and
       a second tier of microchannels defined by a rear surface of the member and grooves in the heat spreader, the second tier of microchannels being above the first tier of microchannels.

16. The apparatus of claim 15, wherein the at least one TFTEC device is formed on the rear surface of the IC die.

17. A system comprising:
    an integrated circuit (IC) die having a front surface on which a microprocessor is formed and a rear surface that is opposite to the front surface;
    a member to define at least one microchannel at the rear surface of the IC die, the microchannel to allow a coolant to flow therethrough;
    at least one thin film thermoelectric cooling (TFTEC) device in the at least one microchannel; and
    a chipset in communication with the microprocessor.

18. The system of claim 17, wherein the at least one TFTEC device is formed on the rear surface of the IC die.

19. The system of claim 17, wherein the TFTEC device includes one of silicon germanium superlattice and beryllium telluride.

20. The system of claim 17, further comprising:
    a coolant circulation system to supply the coolant to the at least one microchannel.

21. The system of claim 18, wherein the member has a front side which faces the rear surface of the IC die, said front side of the member having at least one groove therein to define the at least one microchannel.

22. The system of claim 20, further comprising:
    a drive circuit to supply electrical power to the at least one TFTEC device.

* * * * *

UNITED STATES PATENT AND TRADEMARK OFFICE
CERTIFICATE OF CORRECTION

| | | |
|---|---|---|
| PATENT NO. | : 7,633,752 B2 | Page 1 of 1 |
| APPLICATION NO. | : 10/811597 | |
| DATED | : December 15, 2009 | |
| INVENTOR(S) | : Ravi Prasher | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1190 days.

Signed and Sealed this

Ninth Day of November, 2010

David J. Kappos
*Director of the United States Patent and Trademark Office*